United States Patent
Piro et al.

(10) Patent No.: US 10,063,248 B2
(45) Date of Patent: Aug. 28, 2018

(54) DRIVER ARRANGEMENT AND METHOD FOR PROVIDING AN ANALOG OUTPUT SIGNAL

(71) Applicant: ams AG, Unterpremstaetten (AT)

(72) Inventors: Luigi Di Piro, Ponsacco (IT); Riccardo Serventi, Viareggio (IT); Paolo D'Abramo, Civitavecchia (IT); Edoardo Biagi, Pescia (IT); Luca Fanucci, Montecatini Terme (IT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/302,482

(22) PCT Filed: Mar. 27, 2015

(86) PCT No.: PCT/EP2015/056718
§ 371 (c)(1),
(2) Date: Oct. 6, 2016

(87) PCT Pub. No.: WO2015/155033
PCT Pub. Date: Oct. 15, 2015

(65) Prior Publication Data
US 2017/0041017 A1 Feb. 9, 2017

(30) Foreign Application Priority Data
Apr. 9, 2014 (EP) .................... 14164070

(51) Int. Cl.
*H03M 1/02* (2006.01)
*H03M 1/46* (2006.01)
(Continued)

(52) U.S. Cl.
CPC .......... *H03M 1/02* (2013.01); *H03M 1/1023* (2013.01); *H03M 1/1245* (2013.01); *H03M 1/46* (2013.01)

(58) Field of Classification Search
CPC ....................................... H03M 1/02
(Continued)

(56) References Cited

U.S. PATENT DOCUMENTS

| 4,348,768 A * | 9/1982 | Svala | H04B 14/042 |
| | | | 341/108 |
| 4,677,581 A * | 6/1987 | Malka | G01R 31/2841 |
| | | | 341/118 |

(Continued)

FOREIGN PATENT DOCUMENTS

| EP | 0797305 A1 * | 9/1997 | ............. H03M 1/02 |
| JP | 61052029 A * | 3/1986 | |

(Continued)

OTHER PUBLICATIONS

Pastre, M. et al., "High-Precision Dac Based on a Self-Calibrated Sub-Binary Radix Converter", IEEE International Symposium on Circuits and Systems, 2004, pp. 341-344.
(Continued)

*Primary Examiner* — Howard Williams
(74) *Attorney, Agent, or Firm* — McDermott Will & Emery LLP

(57) ABSTRACT

A driver arrangement (10) comprises a digital controller (11) that is configured to receive a digital input signal (SDI) and a driver (12) that comprises a driver input (14) and a driver output (15) and is configured to provide an analog output signal (SANO) at the driver output (15). The driver arrangement (10) comprises a coupling circuit (13) that comprises a digital-to-analog converter (19) and a feedback circuit (24). The digital-to-analog converter (19) comprises a converter input (20) coupled to the digital controller (11) and a converter output (21) coupled to the driver input (14). The feedback circuit (24) is coupled to the driver output (15) and to a feedback input (17) of the digital controller (11).

12 Claims, 6 Drawing Sheets

(51) Int. Cl.
*H03M 1/12* (2006.01)
*H03M 1/10* (2006.01)

(58) Field of Classification Search
USPC .......................................................... 341/108
See application file for complete search history.

(56) References Cited

U.S. PATENT DOCUMENTS

| | | | | |
|---|---|---|---|---|
| 5,995,033 A | * | 11/1999 | Roeckner | H03M 1/02 |
| | | | | 341/108 |
| 6,448,914 B1 | * | 9/2002 | Younis | H03M 1/02 |
| | | | | 341/108 |

FOREIGN PATENT DOCUMENTS

| | | | | |
|---|---|---|---|---|
| JP | 61065625 A | * | 4/1986 | |
| JP | 07015326 A | * | 1/1995 | |

OTHER PUBLICATIONS

Lee, Y. H., et al., "A Self-Calibration 103-dB SNR Stereo Audio DAC with True-GND Class-D Headphone Drivers in 45nm CMOS", IEEE, SOC Design Conference (ISOCC), 2010, pp. 336-337.

Daigle, C. et al., "A 12-bit 800-MS/s Switched-Capacitor DAC with Open-Loop Output Driver and Digital Predistortion", IEEE Asian Solid-State Circuits Conference, 2010, pp. 1-4.

* cited by examiner

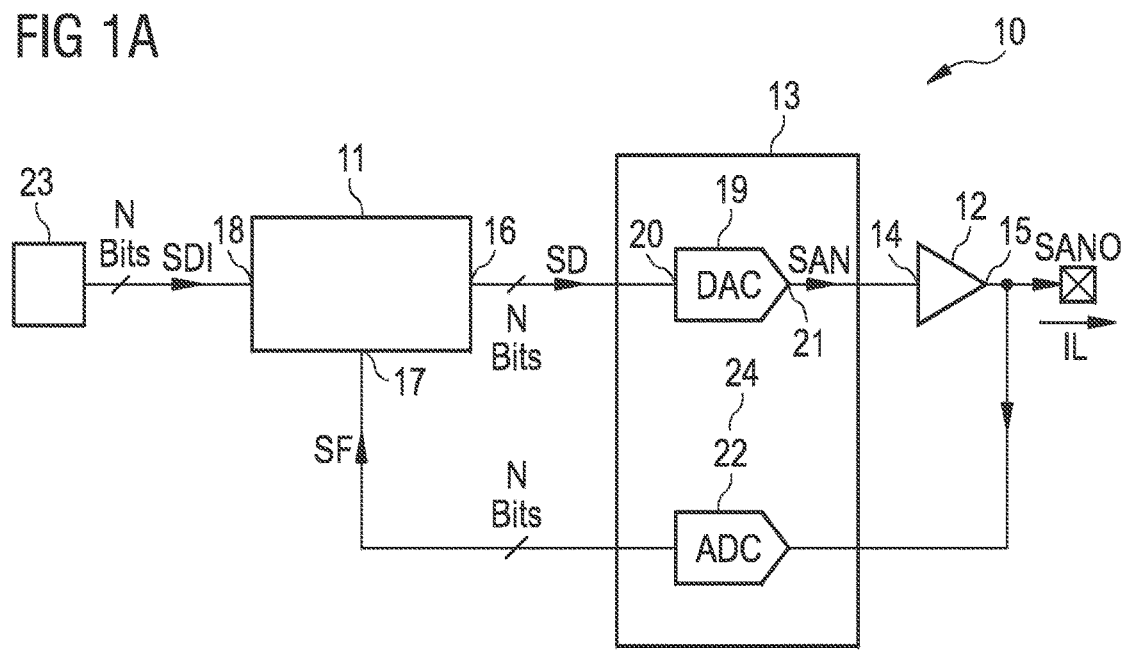

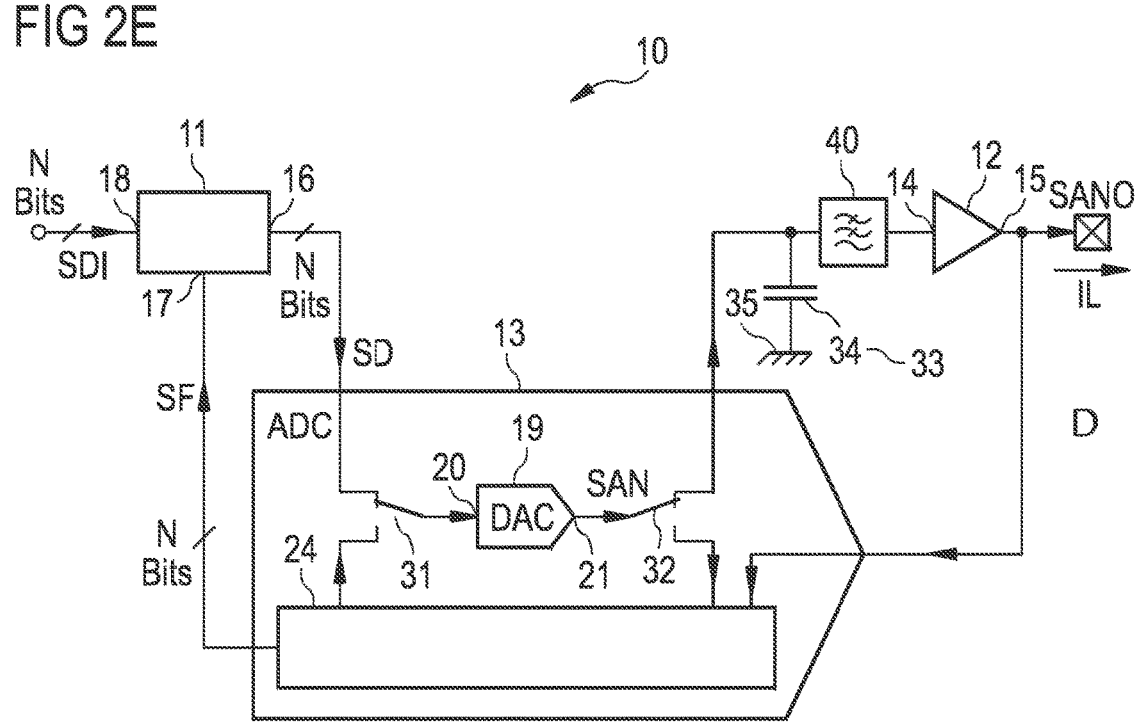

DRIVER ARRANGEMENT AND METHOD FOR PROVIDING AN ANALOG OUTPUT SIGNAL

BACKGROUND OF THE INVENTION

The present invention relates to a driver arrangement and to a method for providing an analog output signal.

A driver arrangement may comprise a digital-to-analog converter and a driver for providing an analog output signal as a function of a digital input signal. This open loop architecture may occupy only a quite small area, but may show a considerable thermal drift of the offset of the analog output signal. Such a drift may be critical in applications having a wide operating temperature range such as automotive applications. If a wide load current range is required, a voltage drop of the analog output voltage due to an output resistance of the driver may affect the resolution of the driver arrangement, especially close to the edges of the operating range of the analog output signal.

SUMMARY OF THE INVENTION

In an embodiment, a driver arrangement comprises a digital controller, a driver and a coupling circuit. The digital controller is configured to receive a digital input signal. The driver comprises a driver input and a driver output and is configured to provide an analog output signal at the driver output. The coupling circuit comprises a digital-to-analog converter and a feedback circuit. The digital-to-analog converter comprises a converter input coupled to the digital controller and a converter output coupled to the driver input. The feedback circuit is coupled to the driver output and to a feedback input of the digital controller.

Optionally, the coupling circuit is arranged between the digital controller and the driver. Advantageously, a feedback is achieved by the feedback circuit that is connected on its input side to the driver output and on its output side to the feedback input of the digital controller. Thus, the digital controller not only receives the digital input signal but also a digital feedback signal generated by the feedback circuit. The accuracy of the analog output signal is increased using the information stored in the digital feedback signal to compensate the static errors of the driver.

In an embodiment, the coupling circuit additionally comprises a change-over switch. In a driving phase, the converter output is coupled to the driver input via the change-over switch. In a sense phase, the converter output is coupled to an input of the feedback circuit via the change-over switch.

In an embodiment, the driving phase follows the sense phase that in turn follows a previous driving phase.

In an embodiment, the coupling circuit generates the digital feedback signal by analog-to-digital conversion of the analog output signal. The coupling circuit acts as analog-to-digital converter.

The feedback circuit may be configured to generate a digital feedback signal and to provide the digital feedback signal to the feedback input.

In an embodiment, the digital controller is able to compare the digital input signal with the digital feedback signal and can adjust a digital signal that the digital controller provides to the digital-to-analog converter. Therefore, a high accuracy of the analog output signal is achieved. The analog output signal can be named output voltage.

In an embodiment, the digital controller is configured to reduce the difference between the digital feedback signal and the digital input signal.

In an embodiment, the digital controller provides the digital signal to the digital-to-analog converter and the digital-to-analog converter converts the digital signal into an analog signal and provides the analog signal to the driver input, optionally via the change-over switch in the driving phase. Thus, the digital-to-analog converter is foreseen for the forward path of a feedback loop.

In an embodiment, the coupling circuit converts the analog output signal into a digital feedback signal, optionally in the sense phase, and provides the digital feedback signal to the feedback input of the digital controller. Therefore, the feedback circuit closes the feedback loop. By the closed loop architecture, a high accuracy of the analog output signal is achieved.

In an embodiment, the feedback circuit is implemented as an analog-to-digital converter. The analog-to-digital converter converts the analog output signal into the digital feedback signal and provides the digital feedback signal to the feedback input of the digital controller. Thus, the digital-to-analog converter realizes the forward path of the closed loop and the analog-to-digital converter implements the feedback path of the closed loop. The analog-to-digital converter is realized separately from the digital-to-analog converter. The analog-to-digital converter may increase the area of the driver arrangement on a semiconductor body. Advantageously, the analog-to-digital converter operates independently from the digital-to-analog converter. A high speed for correcting the analog output signal is achieved.

The driver arrangement implements a smart output stage able to compensate for inaccuracies by exploiting the feedback loop which senses the actual analog output signal through a dedicated analog-to-digital converter and applies a correction according to a particular algorithm implemented with the digital controller.

In a further development, the driving phase and the sense phase alternate. The digital-to-analog converter provides the analog signal to the driver in the driving phase and is used for analog-to-digital conversion of the analog output signal into the digital feedback signal in the sense phase. The driver arrangement with sharing of the digital-to-analog converter is an improved derivative of the driver arrangement with a separate analog-to-digital converter and without sharing the digital-to-analog converter.

In an embodiment, the driving and sense phases continuously alternate during the operating life of the system. During each sense phase the driver output is measured by the analog-to-digital converter and a correction is calculated by the digital controller to minimize the difference between the nominal and the actual value of the driver output. The correction is then implemented in the successive driving phase to keep the actual value of the driver output as close as possible to the nominal value.

In an embodiment, in a present driving phase, the digital controller provides the digital signal as a function of the digital input signal and of the difference between the digital feedback signal received in a previous sense phase and the digital input signal received in a previous driving phase. The present driving phase follows the previous sense phase that in turn follows the previous driving phase.

In an embodiment, the digital controller is configured to reduce the difference between the digital feedback signal and the digital input signal. Optionally, the difference between the digital feedback signal and the digital input signal is zero. The digital signal provided by the digital controller may be different from the digital input signal to compensate a non-linearity in the characteristics of the driver and an output resistance of the driver.

In an embodiment, the coupling circuit determines the digital feedback signal by a successive approximation register principle, abbreviated to SAR principle or SAR method. The coupling circuit uses the digital-to-analog converter and the feedback circuit for generating the digital feedback signal in the sense phase. Thus, the digital-to-analog converter is active in the sense phase and in the driving phase.

In an embodiment, the coupling circuit comprises a multiplexer having a first input coupled to an output of the digital controller, a second input coupled to an output of the feedback circuit and an output coupled to the converter input of the digital-to-analog converter. Thus, the output of the digital controller is connected to the converter input in the driving phase and the output of the feedback circuit is connected to the converter input in the sense phase. Consequently, the digital-to-analog converter receives the digital signal generated from the digital controller in the driving phase and a further signal generated by the feedback circuit in the sense phase.

In an embodiment, the coupling circuit comprises a change-over switch having an input coupled to the converter output of the digital-to-analog converter, a first output coupled to the driver input and a second output coupled to an input of the feedback circuit. Thus, the converter output is coupled to the driver input in the driving phase and to the input of the feedback circuit in the sense phase. Consequently, the digital-to-analog converter provides the analog signal to the driver input of the driver in the driving phase and to the input of the feedback circuit in the sense phase.

In an embodiment, the feedback circuit comprises a comparator and a logic circuit. The logic circuit is coupled on its input side to an output of the comparator. The logic circuit is coupled on its output side to the feedback input of the digital controller.

In an embodiment, the comparator compares the analog output signal with the analog signal generated by the digital-to-analog converter in the sense phase.

In an embodiment, the feedback circuit is implemented as a core using the SAR principle or the SAR method.

Thus, in the sense phase, the logic circuit controls the digital-to-analog converter such that the digital feedback signal corresponding to the digital value of the analog output signal is determined.

In an embodiment, the comparator is coupled on its input side to the driver output and to the second output of the change-over switch and, thus, to the converter output of the digital-to-analog converter. Thus, the comparator receives the analog output signal generated by the driver and the analog signal generated by the digital-to-analog converter in the sense phase.

In an embodiment, the logic circuit is coupled on its output side to a second input of the multiplexer and, thus, to the converter input. In the sense phase, the logic circuit provides a digital signal via the multiplexer to the converter input of the digital-to-analog converter.

The driver arrangement is suitable for applications that require a high accuracy analog output driver. In output stages for sensor based integrated circuits, an output voltage that represents a stored information content is captured by a sensor, digitally post-processed to compensate for systematic errors for example by a digital circuit such as a microprocessor, then converted from digital to analog and amplified by the driver. A high accuracy is very challenging especially in applications with wide operating temperature and load current ranges where the offset temperature drift and on-resistance of the driver can affect the precision of the analog output signal. The driver may be fabricated of high-voltage devices because of the automotive requirements. Additionally, reading back the analog output signal has the advantage of being well-suited for safety-critical applications like automotive.

The addition of the control loop significantly improves the performance. The driver arrangement employs a SAR analog-to-digital converter in the feedback loop and implements a sharing of the inner digital-to-analog converter of the coupling circuit between feedback and direct chain. This minimizes a die size of the driver arrangement. An area comparable to or even smaller than an area of a driver arrangement without feedback loop may be achievable.

In an embodiment, the coupling circuit operates as digital-to-analog converter in the driving phase and as analog-to-digital converter in the sense phase.

In an embodiment, the driver is designed to provide a load current to a load connected to the driver output. The driver may be implemented for driving a heavy load. The driver may be designed for example as a buffer, an amplifier, a constant voltage circuit, a power converter or a low-dropout regulator. The driver may be an electrical circuit that supplies electrical power or controls another circuit or other component such as a transistor like a high-power transistor, a switch like a high-power switch, a motor, a loudspeaker or a lighting arrangement.

In an embodiment, a method for providing an analog output signal comprises receiving a digital input signal by a digital controller. A digital signal is provided by the digital controller to a digital-to-analog converter. The digital-to-analog converter converts the digital signal into an analog signal and provides the analog signal to a driver. An analog output signal is provided by the driver as a function of the analog signal. Moreover, the analog output signal is converted into a digital feedback signal that is provided to the digital controller.

Advantageously, a high accuracy of the analog output signal results from the closed loop architecture. The digital feedback signal corresponds to the digital value of the analog output signal. The digital feedback signal is generated by an analog-to-digital conversion of the analog output signal. The digital feedback signal can be used to adjust the digital signal in such a manner that the digital input signal is equal or has only a small difference to the digital feedback signal. The digital signal may be adjusted for example at more than three values or at each value of the digital input signal.

In an embodiment, the digital-to-analog converter converts the digital signal into the analog signal and provides the analog signal to the driver via a change-over switch in a driving phase.

The digital feedback signal may be generated by a feedback circuit.

In an embodiment, in the driving phase, a converter output of the digital-to-analog converter is coupled to a driver input of the driver via the change-over switch.

In an embodiment, in a sense phase, the converter output is connected to an input of the feedback circuit via the change-over switch.

The driving phase may follow the sense phase that in turn follows a previous driving phase. The sense phase may be also named previous sense phase, since said sense phase is previous to said driving phase.

In an embodiment, the driving and sense phases continuously alternate during the operating life of the driver arrangement.

In an embodiment, during each sense phase, the analog output signal at the driver output is measured by the coupling circuit and a correction is calculated by the digital controller to minimize the difference between the nominal and the actual value of the analog output signal. The correction is then implemented in the successive driving phase to keep the actual value of the analog output signal as close as possible to the nominal value of the analog output signal. The nominal value of the analog output signal is provided by the digital input signal. The digital feedback signal corresponds to the actual value of the analog output signal.

In an embodiment, the digital controller corrects or adjusts the digital signal at the complete range of possible values of the digital input signal and, thus, at the complete range of possible values of the analog output signal.

In an embodiment, the digital controller corrects or adjusts the digital signal for each driving phase, optionally with the exception of the first driving phase.

In an embodiment, the digital controller corrects or adjusts again and again or continuously or consistently the digital signal for the driving phases.

In an embodiment, the digital controller corrects or adjusts again and again or continuously or consistently the digital signal during operation of the driver arrangement.

BRIEF DESCRIPTION OF THE DRAWINGS

The patent application will be described in detail below for several exemplary embodiments with reference to the figures. Components and circuit parts that are functionally identical or have the identical effect bear identical reference numbers. Insofar as components or circuit parts correspond to one another in function, a description of them will not be repeated in each of the following figures. Therein:

FIGS. 1A to 1C show exemplary embodiments of a driver arrangement.

FIGS. 2A to 2E show exemplary embodiments of different phases of a driver arrangement.

DETAILED DESCRIPTION

Figure 1B:
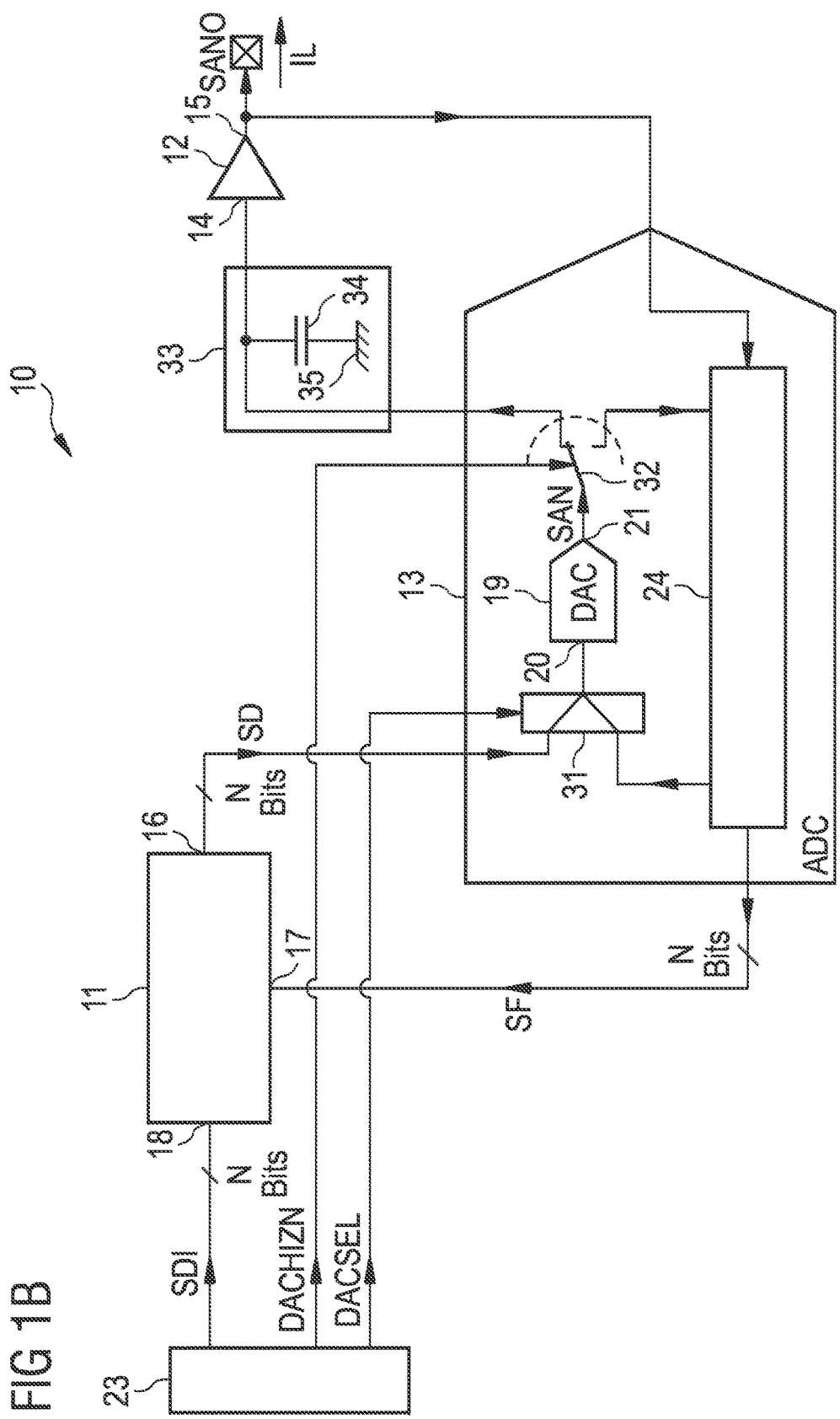

FIG. 1A shows an exemplary embodiment of a driver arrangement 10. The driver arrangement 10 comprises a digital controller 11, a driver 12 and a coupling circuit 13. The coupling circuit 13 couples the digital controller 11 to the driver 12. The driver 12 comprises a driver input 14 and a driver output 15. The digital controller 11 comprises an output 16, a feedback input 17 and an input 18. The coupling circuit 13 comprises a digital-to-analog converter 19, abbreviated to DAC 19, with a converter input 20 and a converter output 21. The output 16 of the digital controller 11 is coupled to the converter input 20. The converter output 21 is coupled to the driver input 14. Furthermore, the coupling circuit 13 comprises a feedback circuit 24. The feedback circuit 24 is coupled on its input side to the driver output 15 and on its output side to the feedback input 17 of the digital controller 11. The feedback circuit 24 is realized as an analog-to-digital converter 22, abbreviated to ADC 22. The ADC 22 connects the driver output 15 to the feedback input 17. The driver arrangement 10 comprises a digital circuit 23 that is coupled to the input 18 of the digital controller 11. In one example, the digital circuit 23 may be realized as a microprocessor or digital core.

A digital input signal SDI is provided to the digital controller 11 via the input 18. The digital circuit 23 generates the digital input signal SDI. The digital controller 11 generates a digital signal SD. The digital signal SD is provided to the converter input 20. The DAC 19 converts the digital signal SD into an analog signal SAN by digital-to-analog conversion. The analog signal SAN is applied to the driver input 14. The driver 12 generates an analog output signal SANO as a function of the analog signal SAN. The analog output signal SANO may have the form of an output voltage. The analog output signal SANO is applied to an input of the ADC 22 that generates a digital feedback signal SF by analog-to-digital conversion of the analog output signal SANO. The digital feedback signal SF is provided to the feedback input 17 of the digital controller 11.

The digital controller 11 generates the digital signal SD as a function of the digital input signal SDI and of the digital feedback signal SF. The digital signal SD is calculated by the digital controller 11 in such a manner that the difference between the digital feedback signal SF and the digital input signal SDI is minimized. The digital controller 11 aims at generating the digital signal SD with such a value that the digital feedback signal SF is equal to the digital input signal SDI. Thus, the influence of any disturbance which changes the value of the analog output signal SANO or has an influence on the characteristics of the driver 12, such as temperature, connection to a load, load current or another factor, can be reduced. The digital input signal SDI, the digital signal SD and the digital feedback signal SF each have N bits.

A load current IL can flow from the driver 12 to a not shown load. An increase of the load current IL may reduce the value of the analog output signal SANO due to an output resistance of the driver 12. Such a reduction of the analog output signal SANO is detected by the coupling circuit 13, especially by the ADC 22 and compensated by increasing a value of the digital signal SD.

The driver arrangement 10 may be designed as an automotive output stage. The known architecture for output stages suitable for automotive application is made up of the DAC 19 and the driver 12 that may also be named output driver. While an open loop architecture suffers a considerably thermal drift of the offset on the analog output signal SANO, this drift can be minimized by the closed loop. This is advantageous in applications having a wide operating temperature range such as in automotive applications. Another advantage of the driver arrangement 10 shown in FIG. 1A is that if a wide load current range is required, the voltage drop of the analog output signal SANO due to the output resistance of the driver 12 cannot affect the resolution of the whole system, even at the edges of the operating range of the analog output signal SANO.

The driver arrangement 10 is realized as a closed loop output stage. Thus, a control of the analog output signal SANO is achieved by the use of a feedback loop. The purpose of the feedback loop is to compensate for the offset of the driver arrangement 10 due to thermal drift and to improve the load regulation of the driver 12. The analog output signal SANO is sensed through a dedicated ADC 22 in the feedback chain. The error between the actual and the target value is computed and the correction is applied in accordance with a particular control algorithm by the digital controller 11.

Figure 1C:
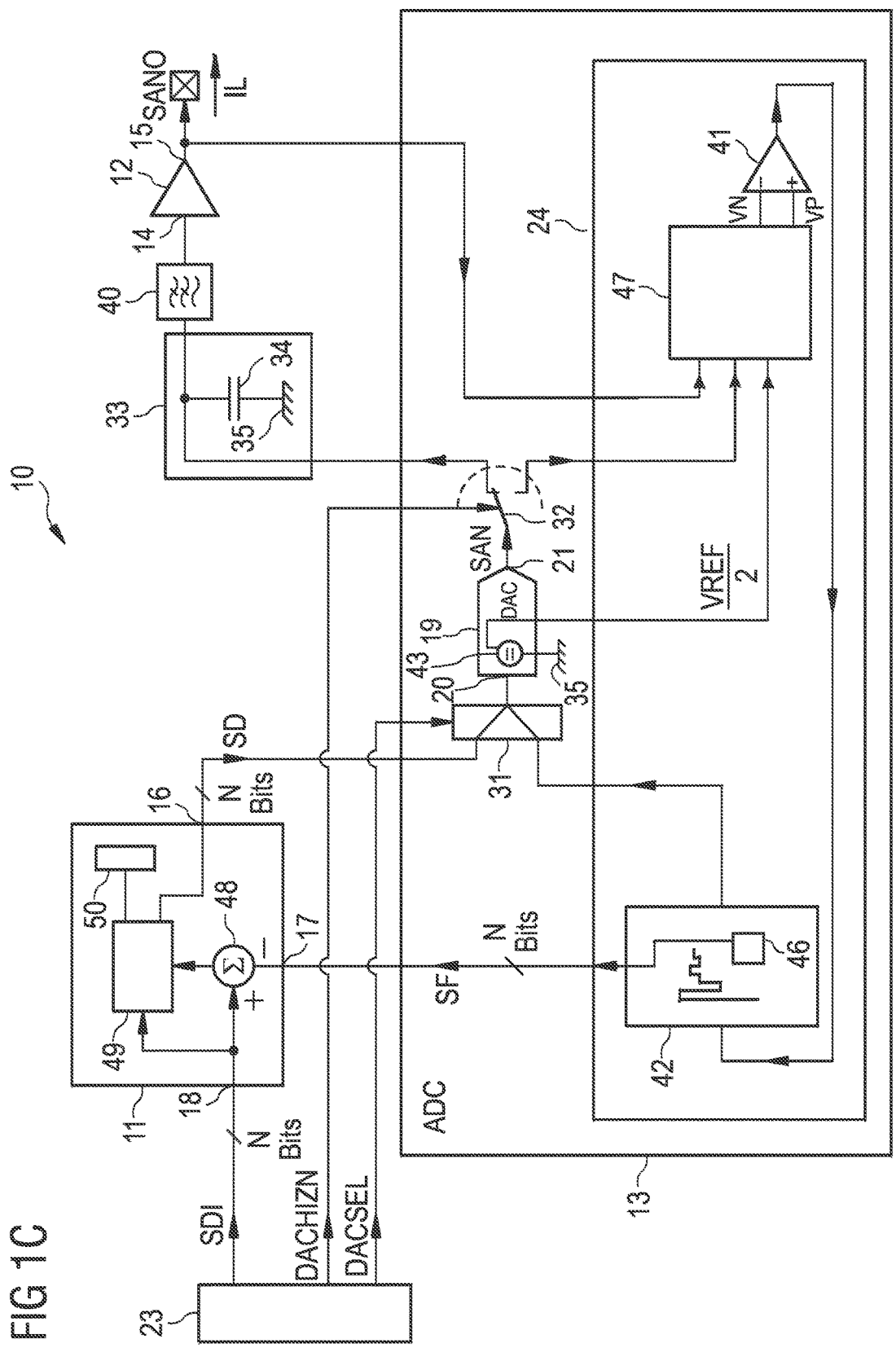

Closed loop solutions as shown in FIGS. 1A to 1C are suitable for applications requiring a high precision analog output stage. The analog output signal read-back feature improves the system performance in terms of thermal drift and load regulation. It also allows detection of defects and failures, significantly increasing the safety level of the system. The read-back feature allows to implement checks covering any fault on the signal chain. These faults are not to be detected by the system in an open loop structure. Thus, the driver arrangement 10 has the advantage of being a good fit for safety-critical applications like automotive.

The driver arrangement 10 is fabricated on an area on a semiconductor body.

In case of the driver arrangement 10 as shown in FIG. 1A, the occupied area is increased because even if the presence of the control loop permits relaxation of the performance of the elements on the direct chain, consequently reducing their dimensions, the overall size of this system is bigger than a solution without feedback loop.

In an alternative embodiment, not shown, the digital feedback signal SF has more than N bits. The high accuracy of the digital feedback signal SF results in a reduced switching of the digital signal SD between two neighboring values.

FIG. 1B shows an alternative embodiment of the driver arrangement 10 which is a further development of the driver arrangement shown in FIG. 1A. The coupling circuit 13 comprises the DAC 19 and the feedback circuit 24. The feedback circuit 24 is realized as a successive approximation register core, abbreviated to SAR core. The feedback circuit 24 uses the DAC 19 for digitalization of the analog output signal SANO into the digital feedback signal SF.

Furthermore, the coupling circuit 13 comprises a multiplexer 31. A first input of the multiplexer 31 is connected to the output 16 of the digital controller 11. A second input of the multiplexer 31 is connected to an output of the feedback circuit 24. An output of the multiplexer 31 is connected to the converter input 20. Additionally, the coupling circuit 13 comprises a change-over switch 32. An input of the change-over switch 32 is connected to the converter output 21. A first output of the change-over switch 32 is coupled to the driver input 14. A second output of the change-over switch 32 is connected to an input of the feedback circuit 24. The driver output 15 is connected to another input of the feedback circuit 24. An additional output of the feedback circuit 24 is coupled to the feedback input 17 of the digital controller 11.

Moreover, the driver arrangement 10 comprises a hold circuit 33 that is arranged between the first output of the change-over switch 32 and the driver input 14. The hold circuit 33 comprises a hold capacitor 34. The hold capacitor 34 couples the driver input 14 to a reference potential terminal 35. The digital circuit 23 is coupled on its output side to a control terminal of the multiplexer 31 and a control terminal of the change-over switch 32.

The digital circuit 23 generates a control signal DACSEL that is provided to the control terminal of the multiplexer 31. Furthermore, the digital circuit 23 generates a further control signal DACHIZN that is applied to the control terminal of the change-over switch 32.

The DAC 19 is either connected between the digital controller 11 and the driver 12 for generating the analog signal SAN or is connected to the feedback circuit 24 for generating the digital feedback signal SF by selecting the proper positions of the multiplexer 31 and of the change-over switch 32.

As elucidated in FIG. 1B, the feedback loop is implemented by using a SAR ADC. Its inner DAC 19 is then shared between the ADC 22 and the direct chain. In the architecture shown in FIG. 1B, the DAC 19 is normally connected to the direct chain, and it is only switched to the SAR structure during the conversion phase of the ADC 22, saving the area of a dedicated analog-to-digital converter for the loop. During a read-back period of the analog output signal SANO, an input voltage of the driver 12 is fixed by a sample-and-hold capacitor 34, which previously stores the corrected voltage value guaranteeing a continuous analog output signal SANO on the output pin 15.

The driver arrangement 10 in FIG. 1B, through the sharing mechanism of the DAC 19, represents an evolution of the embodiment shown in FIG. 1A and allows a significant reduction in the size of the device because most of the area of a SAR ADC is occupied by the inner DAC 19 which is shared between the two chains. In conclusion, the driver arrangement 10 offers the same performance in terms of linearity, thermal offset drift and safety as the solution shown in FIG. 1A, with a die size smaller than the solution shown in FIG. 1A.

FIG. 1C shows an alternative embodiment of the driver arrangement 10 which is a further development of the embodiments shown in FIGS. 1A and 1B. The digital controller 11 and the feedback circuit 24 as shown in FIG. 1C are exemplary embodiments of possible implementations. The digital controller 11 and the feedback circuit 24 can alternatively be realized by other circuits.

The driver arrangement 10 comprises a low pass filter 40 that is connected upstream of the driver input 14. The low pass filter 40 is arranged between the hold circuit 33 and the driver input 14.

The feedback circuit 24 can be designed to work as successive-approximation-register analog-to-digital converter, abbreviated to SAR ADC, during a sense phase S. The feedback circuit 24 comprises a comparator 41 and a logic circuit 42. An output of the comparator 41 is connected to an input of the logic circuit 42. An output of the logic circuit 42 is connected to the feedback input 17 of the digital controller 11. The logic circuit 42 comprises a register 46. The comparator 41 is coupled on its input side to the driver output 15 and the converter output 21 via the second output of the change-over switch 32 and a sample-and-hold circuit 47 of the feedback circuit 24. The DAC 19 comprises a reference voltage source 43. An output of the reference voltage source 43 is coupled via the sample-and-hold circuit 47 to the input side of the comparator 41. A first input of the comparator 41 is a non-inverting input. A second input of the comparator 41 is an inverting input. Thus, the second output of the change-over switch 32, the driver output 15 and the reference voltage source 43 are coupled to the first and the second input of the comparator 41 via the sample-and-hold circuit 47.

The digital controller 11 comprises a subtracting unit 48. A non-subtracting input of the subtracting unit 48 is connected to the digital circuit 23 via the input 18. A subtracting input of the subtracting unit 48 is connected to the feedback input 17 of the digital controller 11. Moreover, the digital controller 11 comprises a controller logic 49 that is connected on its output side to the output 16 of the digital controller 11. On the input side, the controller logic 49 is connected to the digital circuit 23 via the input 18 and to an output of the subtracting unit 48. The digital controller 11 comprises a memory 50 that is connected to the controller logic 49.

The subtracting unit 48 receives the digital input signal SDI and the digital feedback signal SF and provides the difference between the digital input signal SDI and the digital feedback signal SF to the controller logic 49. The controller logic 49 also receives the digital input signal SDI from the digital circuit 23. The controller logic 49 calculates the digital signal SD as a function of the digital input signal SDI and of the difference between the digital input signal SDI and the digital feedback signal SF. A previous value of the digital input signal SDI or a previous value of the difference between the digital input signal SDI and the digital feedback signal SF may be stored in the memory 50 and used to calculate the digital signal SD. The digital signal SD is calculated to correct any disturbance affecting the analog output signal SANO, minimizing the difference between the digital input signal SDI and the digital feedback signal SF.

The logic circuit 42 exploits the DAC 19, the comparator 41 and the sample-and-hold circuit 47 to perform the analog-to-digital conversion of the analog output signal SANO.

During the conversion the logic circuit 42 implements a particular algorithm, which allows the analog signal SAN of the DAC 19 to successively approach the value of the analog output signal SANO, accordingly to a SAR operation. At the end of the conversion the analog signal SAN provided by the DAC 19 is equal to the value of the analog output signal SANO, at least of an error lower than the resolution of the ADC, and the corresponding digital input of the DAC 19 is the value of the analog output signal SANO converted in the digital domain. The reference voltage source 43 provides a reference voltage VREF/2, where VREF is the maximum voltage that the DAC 19 can provide.

So the voltage value of the analog output signal SANO is converted into the digital feedback signal SF and, thus, into the digital domain. At each step of the conversion algorithm, the result of the comparator 41 is stored in the register 46. At the end of the sense phase S, the information stored in the register 46 is provided to the digital controller 11 as the digital feedback signal SF.

In an alternative, not shown embodiment, the digital controller 11 is connected on its output side to the control terminals of the multiplexer 31 and of the change-over switch 32. Thus, the digital controller 11 provides the two control signals DACSEL, DACHIZN.

The digital controller 11 may be implemented as a microprocessor or as another digital circuit. The subtracting unit 48 may be realized with digital circuit parts or using a software code.

In an alternative, not shown embodiment, the feedback circuit 24 is implemented in another way. For example, the reference voltage source 43 is not connected to the sample-and-hold circuit 47.

Figure 2A:
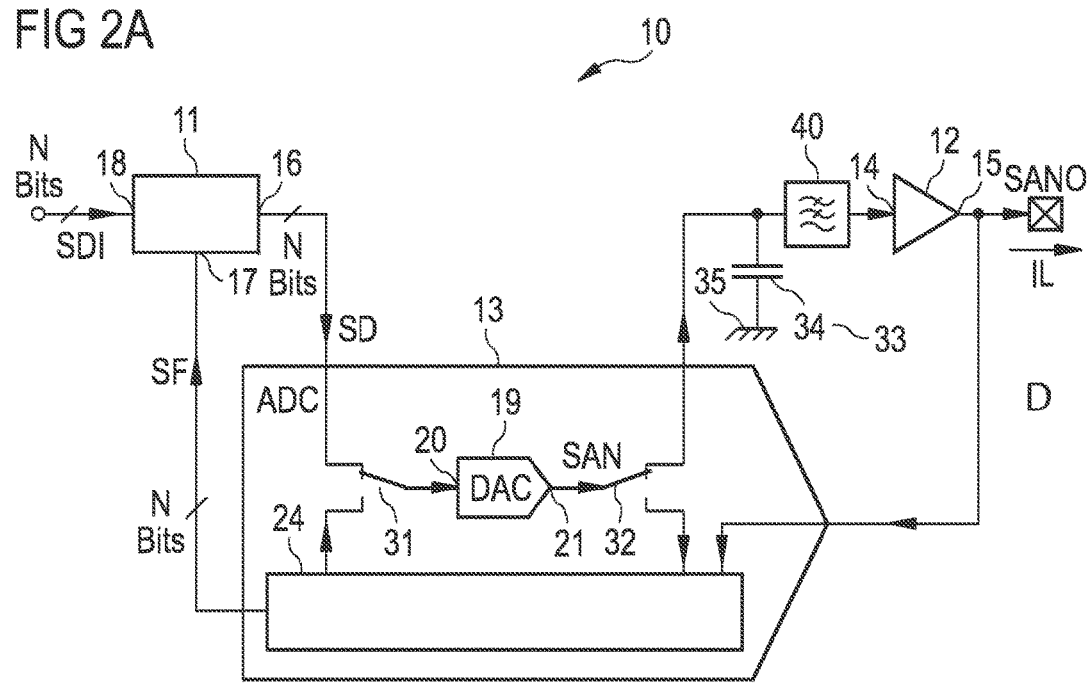
Figure 2B:
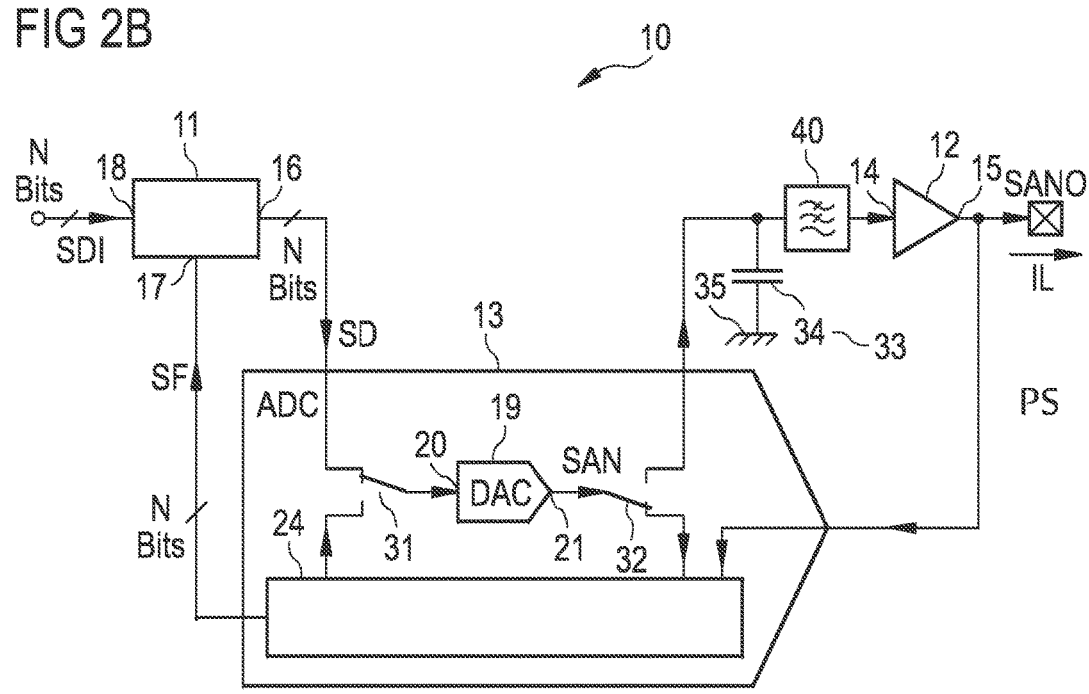

FIGS. 2A to 2E show the operation of the driver arrangement 10 shown in FIGS. 1B to 1C. The driver arrangement 10 performs a driving phase D illustrated in FIG. 2A and the sense phase S illustrated in FIG. 2C. Furthermore, the driver arrangement 10 performs a pre-sense phase PS as shown in FIG. 2B and a pre-driving phase PD illustrated in FIG. 2D. FIG. 2E illustrates a further driving phase D. The pre-sense phase PS is arranged between the driving phase D and the sense phase S, the pre-driving phase PD is arranged between the sense phase S and the driving phase D. Thus, a complete cycle comprises four phases, namely the driving phase D, the pre-sense phase PS, the sense phase S, and the pre-driving phase PD. The digital circuit 23 controls these four phases.

As shown in FIG. 2A, in the driving phase D, the output 16 of the digital controller 11 is connected to the converter input 20 via the multiplexer 31. Thus, the multiplexer 31 obtains a position such that the first input of the multiplexer 31 is electrically connected to the converter input 20. The converter output 21 is coupled to the driver input 14 via the change-over switch 32. Thus, the change-over switch 32 has a position such that the converter output 21 is electrically connected to the driver input 14 via the hold circuit 33 and the low pass filter 40. The digital signal SD provided by the digital controller 11 is applied to the converter input 20. The analog signal SAN generated at the converter output 21 as a function of the digital signal SD is applied to the driver input 14. The driver 12 generates the analog output signal SANO as a function of the analog signal SAN. At the beginning, the DAC 19 is connected to the direct chain and the analog output signal SANO reaches steady state.

In FIG. 2B, in the pre-sense phase PS, the change-over switch 32 changes its position. Thus, the converter output 21 is connected to the second output of the change-over switch 32 and thus to the input of the feedback circuit 24. The output 16 of the digital controller 11 is still coupled to the converter input 20 via the multiplexer 31. The hold circuit 33 and the low pass filter 40 are implemented in such a manner that an input signal of the driver 12 stays constant in the pre-sense phase PS, in the following sense phase S as well as in the following pre-driving phase PD. Thus, the hold circuit 33 and the low pass filter 40 are designed so that the signal at the driver input 14 is only changed in the driving phase D and is kept constant in the phases between two driving phases D.

Figure 2C:
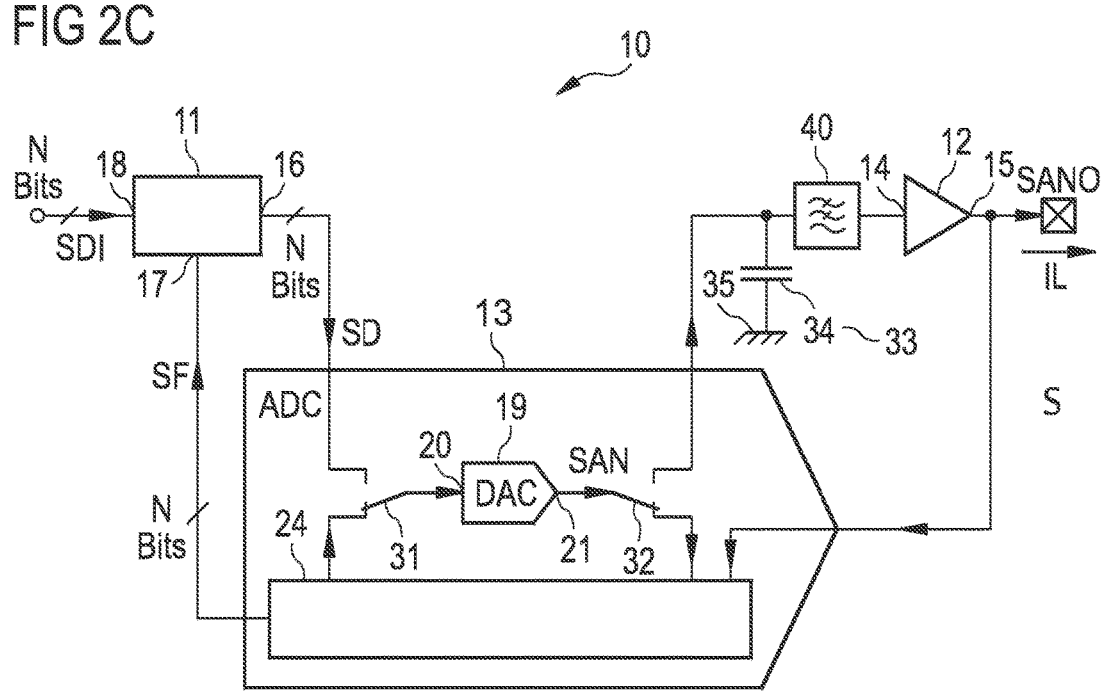

As shown in FIG. 2C, in the sense phase S, the output of the feedback circuit 24 is connected to the converter input 20 via the multiplexer 31. Thus, the second input of the multiplexer 31 is electrically connected to the converter input 20. The converter output 21 is still connected to the input of the feedback circuit 24 via the change-over switch 32. In the sense phase S during the operation of the comparator 41 and of the logic circuit 42 as shown in FIG. 1C, the feedback circuit 24 generates the digital feedback signal SF.

As shown in FIGS. 2B and 2C, the DAC 19 is first disconnected from the direct chain and then connected to the feedback circuit 24 to sense the analog output signal SANO. These actions are performed separately to avoid spikes on the driver output 15. Also, the sample-and-hold circuit 47 on the input terminal of the comparator 41 is protected against any possible disturbance related to the switching because, in this condition shown in FIG. 2B, the operation of the feedback circuit 24 and the analog-to-digital conversion procedure are stopped and the converter output 21 of the DAC 19 is internally kept disconnected from the inner sample-and-hold circuit by the feedback circuit 24 itself.

In this condition shown in FIG. 2C, the operation of the feedback circuit 24 is restored and the analog-to-digital conversion is performed. In this period, the input voltage of the driver 12 is fixed by the voltage value previously stored by the hold capacitor 34. A continuous analog output signal SANO can then be achieved.

Figure 2D:
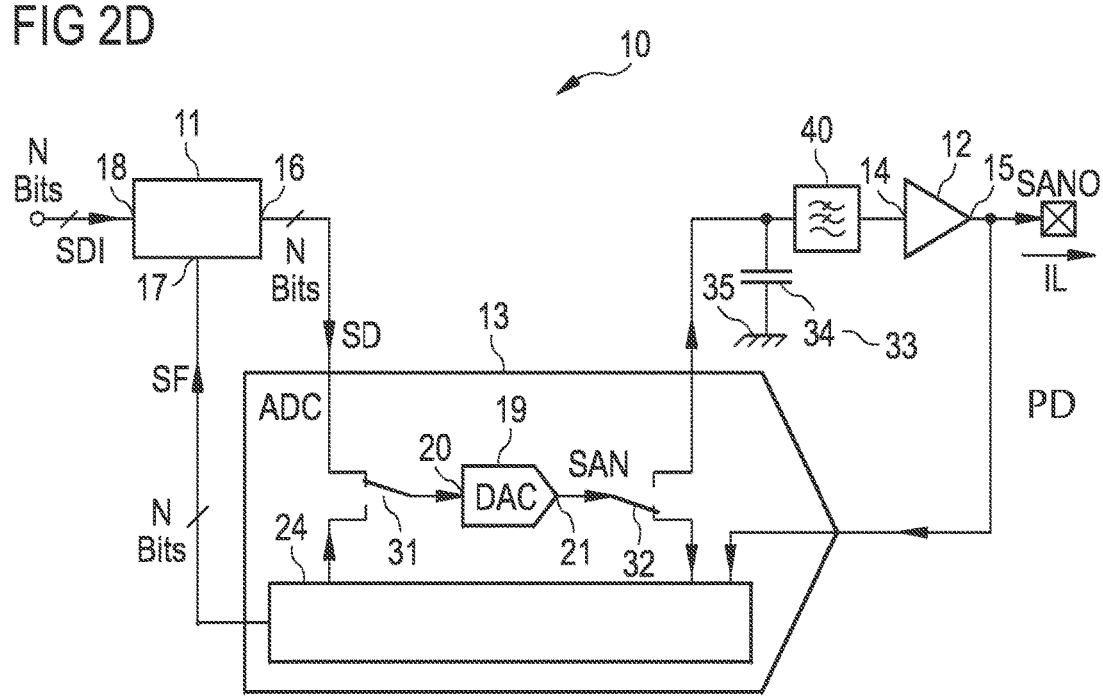

As elucidated in FIG. 2D, in the pre-driving phase PD, the output 16 of the digital controller 11 is connected via the multiplexer 31 to the converter input 20. Thus, the first input of the multiplexer 31 is electrically connected to the converter input 20. The converter output 21 is still connected to the input of the feedback circuit 24 via the change-over switch 32. The digital signal SD generated by the digital controller 11 is provided to the DAC 19, therefore, the analog signal SAN can be stabilized before it is applied to the driver input 14.

The DAC 19 is now again connected to the driver input 14 following the procedure described above to avoid any switching disturbance effects on the driver output 15. The digital controller 11 computes the result of the ADC conversion to calculate the actual correction and applies it to the converter input 20.

Finally, the response of the driver 12 starts and a new steady-state condition is reached when the transient is extinguished, the direct chain sample-and-hold capacitor 34 stores a new value, and the next iteration of correction can take place.

In FIG. 2E, the converter output 21 is coupled via the change-over switch 32, the hold circuit 33 and the low pass filter 40 to the driver input 14. The switching positions in FIG. 2E are equal to the switching positions of the multiplexer 31 and of the change-over switch 32 shown in FIG. 2A. Thus, the driver arrangement 10 is implemented as a closed loop output stage. By sharing the DAC 19, the driver arrangement 10 can be fabricated with high efficiency.

The invention claimed is:

1. A driver arrangement, comprising:
a digital controller that is configured to receive a digital input signal;
a driver that comprises a driver input and a driver output and is configured to provide an analog output signal at the driver output;
a coupling circuit that comprises a digital-to-analog converter, a feedback circuit, a change-over switch and a multiplexer;
a low pass filter; and
a hold circuit, the hold circuit and the low pass filter being arranged between the change-over switch and the driver input,
wherein the digital-to-analog converter comprises a converter input and a converter output and the feedback circuit is coupled to the driver output and to a feedback input of the digital controller,
wherein the driver arrangement performs a cycle that comprises four phases which are a driving phase, a pre-sense phase, a sense phase and a pre-driving phase,
wherein in the driving phase, the digital controller is coupled to the converter input via the multiplexer and the converter output is coupled to the driver input via the change-over switch, the hold circuit and the low pass filter,
wherein in the pre-sense phase, the digital controller is coupled to the converter input via the multiplexer and the converter output is coupled to an input of the feedback circuit via the change-over switch,
wherein in the sense phase, an output of the feedback circuit is coupled to the converter input via the multiplexer and the converter output is coupled to the input of the feedback circuit via the change-over switch,
wherein in the pre-driving phase, the digital controller is coupled to the converter input via the multiplexer and the converter output is coupled to the input of the feedback circuit via the change-over switch,
wherein the coupling circuit is designed to convert the analog output signal into a digital feedback signal in the sense phase by a successive approximation register principle by means of the digital-to-analog converter and the feedback circuit and to provide the digital feedback signal to the feedback input of the digital controller, and
wherein the hold circuit and the low pass filter are designed such that the signal at the driver input is only changed in the driving phase and is kept constant in the phases between two driving phases.

2. The driver arrangement according to claim 1, wherein the digital controller is configured to provide a digital signal to the digital-to-analog converter via the multiplexer and the digital-to-analog converter is configured to convert the digital signal into an analog signal and to provide the analog signal to the driver input via the change-over switch, the hold circuit and the low pass filter in the driving phase.

3. The driver arrangement according to claim 1, wherein the multiplexer has a first input coupled to an output of the digital controller, a second input coupled to the output of the feedback circuit and an output coupled to the converter input.

4. The driver arrangement according to claim 1, wherein the change-over switch has an input coupled to the converter output, a first output coupled to the driver input via the hold circuit and the low pass filter and a second output coupled to the input of the feedback circuit.

5. The driver arrangement according to claim 1, wherein the feedback circuit comprises a comparator and a logic circuit that is coupled on its input side to an output of the comparator and on its output side to the feedback input of the digital controller.

6. The driver arrangement according to claim 5, wherein the comparator is designed for an algorithm for conversion of the analog output signal into the digital feedback signal.

7. The driver arrangement according to claim 5, wherein the comparator is coupled on its input side to the driver output and via the change-over switch to the converter output.

8. The driver arrangement according to claim 5, wherein the logic circuit is coupled on its output side via the multiplexer to the converter input.

9. The driver arrangement according to claim 1, wherein the driving phase and the sense phase alternate and the digital-to-analog converter is implemented for digital-to-analog conversion for providing an analog signal to the driver in the driving phase and for analog-to-digital conversion of the analog output signal into a digital feedback signal in the sense phase.

10. The driver arrangement according to claim 9, wherein in the driving phase that follows a previous sense phase the digital controller is configured to provide a digital signal as a function of the digital input signal, of the digital feedback signal received in the previous sense phases and of the digital input signal received in the previous driving phase.

11. A method for providing an analog output signal, comprising:
receiving a digital input signal by a digital controller;
providing a digital signal by the digital controller via a multiplexer to a converter input of a digital-to-analog converter that converts the digital signal into an analog signal and provides the analog signal to a driver via a change-over switch, a hold circuit and a low pass filter in a driving phase;
providing an analog output signal by the driver as a function of the analog signal; and
converting the analog output signal into a digital feedback signal that is generated by a feedback circuit and the digital-to-analog converter in a sense phase by a successive approximation register principle and providing the digital feedback signal to the digital controller,
wherein in the driving phase, a converter output of the digital-to-analog converter is coupled to a driver input of the driver via the change-over switch, the hold circuit and the low pass filter, the hold circuit and the low pass filter being arranged between the change-over switch and the driver input,
wherein in the sense phase, the converter output is coupled to an input side of a comparator of the feedback circuit via the change-over switch and a driver output of the driver is coupled to the input side of the comparator, wherein the driving phase follows the sense phase that in turn follows a previous driving phase, wherein an output of the feedback circuit is connected to the converter input via the multiplexer in the sense phase, and wherein the hold circuit and the low pass filter are designed such that the signal at the driver input is only changed in the driving phase and is kept constant in the phases between two driving phases.

12. A driver arrangement, comprising:
a digital controller that is configured to receive a digital input signal;
a driver that comprises a driver input and a driver output and is configured to provide an analog output signal at the driver output;
a coupling circuit that comprises a digital-to-analog converter, a feedback circuit, a change-over switch and a multiplexer;
a hold circuit; and
a low pass filter, wherein the digital-to-analog converter comprises a converter input and a converter output, wherein the multiplexer comprises a first input coupled to an output of the digital controller, a second input coupled to an output of the feedback circuit and an output coupled to the converter input, wherein the change-over switch comprises an input coupled to the converter output, a first output coupled via the hold circuit and the low pass filter to the driver input and a second output, wherein the feedback circuit comprises a comparator that is coupled on its input side to the driver output and to the second output of the change-over switch, and wherein the feedback circuit is coupled to a feedback input of the digital controller.

* * * * *